(12) United States Patent
Ku et al.

(10) Patent No.: US 12,309,953 B2
(45) Date of Patent: May 20, 2025

(54) OUTDOOR ELECTRONIC APPARATUS AND SUNSHADE THEREOF

(71) Applicant: WISTRON NEWEB CORPORATION, Hsinchu (TW)

(72) Inventors: Yu-Fu Ku, Hsinchu (TW); Yi-Hsuan Wu, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 576 days.

(21) Appl. No.: 17/554,002

(22) Filed: Dec. 17, 2021

(65) Prior Publication Data

US 2022/0282568 A1 Sep. 8, 2022

(30) Foreign Application Priority Data

Mar. 3, 2021 (TW) .................................. 110107519

(51) Int. Cl.
*H05K 5/03* (2006.01)
*H05K 7/20* (2006.01)

(52) U.S. Cl.
CPC ........... *H05K 5/03* (2013.01); *H05K 7/20127* (2013.01)

(58) Field of Classification Search
CPC .............................. H05K 5/03; H05K 7/20127
See application file for complete search history.

(56) References Cited

U.S. PATENT DOCUMENTS

| 4,615,181 A | 10/1986 | Greenwood | |
|---|---|---|---|
| 2010/0073943 A1* | 3/2010 | Yeh | F21V 29/74 |
| | | | 362/373 |
| 2017/0312863 A1* | 11/2017 | Melius | B23K 37/003 |
| 2019/0150318 A1* | 5/2019 | Furuya | H05K 7/20181 |
| | | | 361/692 |
| 2023/0292470 A1* | 9/2023 | Ueno | H05K 7/20127 |

FOREIGN PATENT DOCUMENTS

CN  111405816 A  * 7/2020

* cited by examiner

*Primary Examiner* — Jorge A Pereiro
*Assistant Examiner* — Michael James Giordano
(74) *Attorney, Agent, or Firm* — McClure, Qualey & Rodack, LLP

(57) ABSTRACT

An outdoor electronic apparatus and a sunshade thereof are provided. The sunshade is assembled to an electronic device, and includes a top shield and a plurality of shielding structures formed on the top shield. The top shield has a plurality of top convection holes at least partially corresponding in position to the shielding structures. An edge of any one of the shielding structures and a hole edge of the corresponding top convection hole jointly define a first interface region having an outflow area. The sunshade and an outer surface of the electronic device jointly define a second interface region that is in spatial communication with the first interface regions of the top shield and that has an inflow area. The inflow area is greater than or equal to at least 20% of a sum of the outflow areas of the top shield.

10 Claims, 13 Drawing Sheets

OUTDOOR ELECTRONIC APPARATUS AND SUNSHADE THEREOF

CROSS-REFERENCE TO RELATED PATENT APPLICATION

This application claims the benefit of priority to Taiwan Patent Application No. 110107519, filed on Mar. 3, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic apparatus, and more particularly to an outdoor electronic apparatus and a sunshade thereof.

BACKGROUND OF THE DISCLOSURE

A conventional outdoor electronic apparatus often experiences a rise in temperature due to exposure to sunlight. Accordingly, for the conventional outdoor electronic apparatus, the sunlight can be shielded by additionally assembling a sunshade onto an electronic device of the conventional outdoor electronic apparatus. However, the sunshade of the conventional outdoor electronic apparatus often decreases a heat dissipation effect from convection of the electronic device.

SUMMARY OF THE DISCLOSURE

In response to the above-referenced technical inadequacy, the present disclosure provides an outdoor electronic apparatus and a sunshade thereof to effectively improve on the issues associated with conventional outdoor electronic apparatuses.

In one aspect, the present disclosure provides an outdoor electronic apparatus, which includes a sunshade and an electronic device that is assembled to the sunshade. The sunshade includes a top shield and a plurality of shielding structures that are formed on the top shield. The top shield has a plurality of top convection holes each having a hole area, and at least part of the top convection holes respectively correspond in position to the shielding structures. An edge of any one of the shielding structures and a hole edge of the corresponding top convection hole jointly define a first interface region having an outflow area. Moreover, a top portion of the electronic device and the top shield have a heat dissipating space there-between that is in spatial communication with the top convection holes. The sunshade and an outer surface of the electronic device jointly define a second interface region that is in spatial communication with the heat dissipating space and that has an inflow area, and wherein the inflow area is greater than or equal to at least 20% of a sum of the outflow areas of the top shield.

In another aspect, the present disclosure provides an outdoor electronic apparatus, which includes a sunshade and an electronic device that is assembled to the sunshade. The sunshade includes a top shield and a plurality of shielding structures that are formed on the top shield. The top shield has a plurality of top convection holes each having a hole area, and at least part of the top convection holes respectively correspond in position to the shielding structures. An edge of any one of the shielding structures and a hole edge of the corresponding top convection hole jointly define a first interface region having an outflow area. A sum of the hole areas of the top convection holes is greater than or equal to at least 20% of a sum of the outflow areas of the top shield. Moreover, a top portion of the electronic device and the top shield have a heat dissipating space there-between that is in spatial communication with the top convection holes.

In yet another aspect, the present disclosure provides a sunshade of an outdoor electronic apparatus. The sunshade includes a top shield and at least one shielding structure. The top shield has at least one top convection hole having a hole area. The at least one shielding structure is formed on the top shield and corresponds in position to the at least one top convection hole. Moreover, an edge of the at least one shielding structure and a hole edge of the at least one top convection hole jointly define a first interface region having an outflow area. The hole area is greater than or equal to at least 20% of the outflow area.

Therefore, the outdoor electronic apparatus of the present disclosure allows airflow to flow smoothly therein by the structural design of the sunshade or the structural cooperation of the sunshade and the electronic device (e.g., the inflow area is greater than or equal to at least 20% of the sum of the outflow areas of the top shield).

Specifically, by the structural cooperation of the shielding structures and the top convection holes in the sunshade of the present disclosure (e.g., the sum of the hole areas of the top convection holes is greater than or equal to at least 20% of the sum of the outflow areas of the top shield; or, in any one of the shielding structures and the corresponding top convection hole, the hole area is greater than or equal to at least 20% of the outflow area), any one of the shielding structures can be configured to shield sunlight and to simultaneously avoid affecting the flow of air passing through the corresponding top convection hole, so that the outdoor electronic apparatus can have a better convection effect.

Moreover, the shielding structures of the sunshade in the present disclosure cover 1% to 100% of the sum of the hole areas of the top convection holes along the vertical direction, so that the shielding structures can be used to effectively shield sunlight for the top convection holes.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
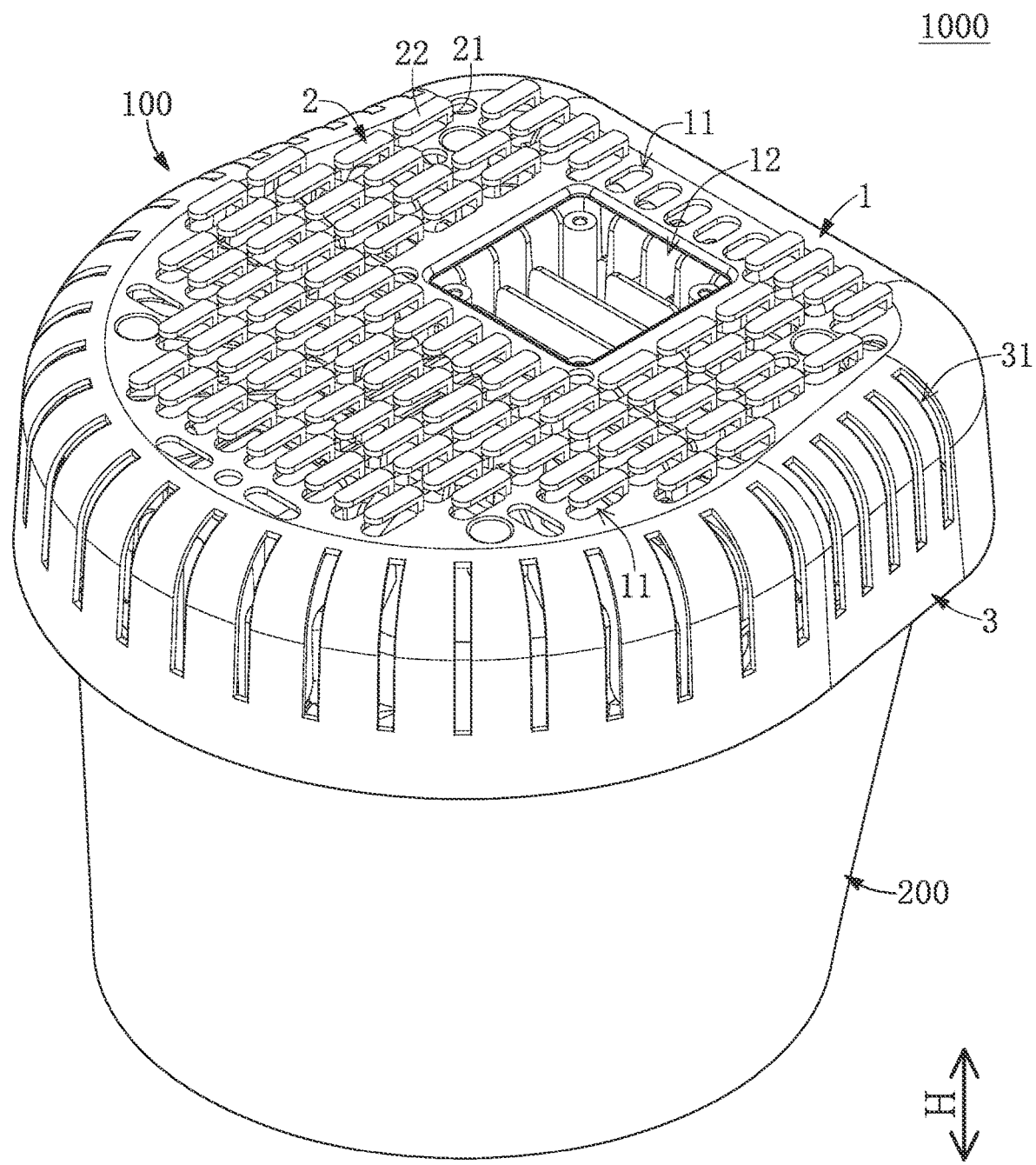
FIG. 1 is a perspective view of an outdoor electronic apparatus according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 7, a first embodiment of the present disclosure provides an outdoor electronic apparatus 1000 that preferably excludes any indoor electronic apparatus. The outdoor electronic apparatus 1000 includes a sunshade 100 and an electronic device 200 that is assembled to the sunshade 100, but the type of the electronic device 200 can be changed or adjusted according to design requirements.

Figure 2:
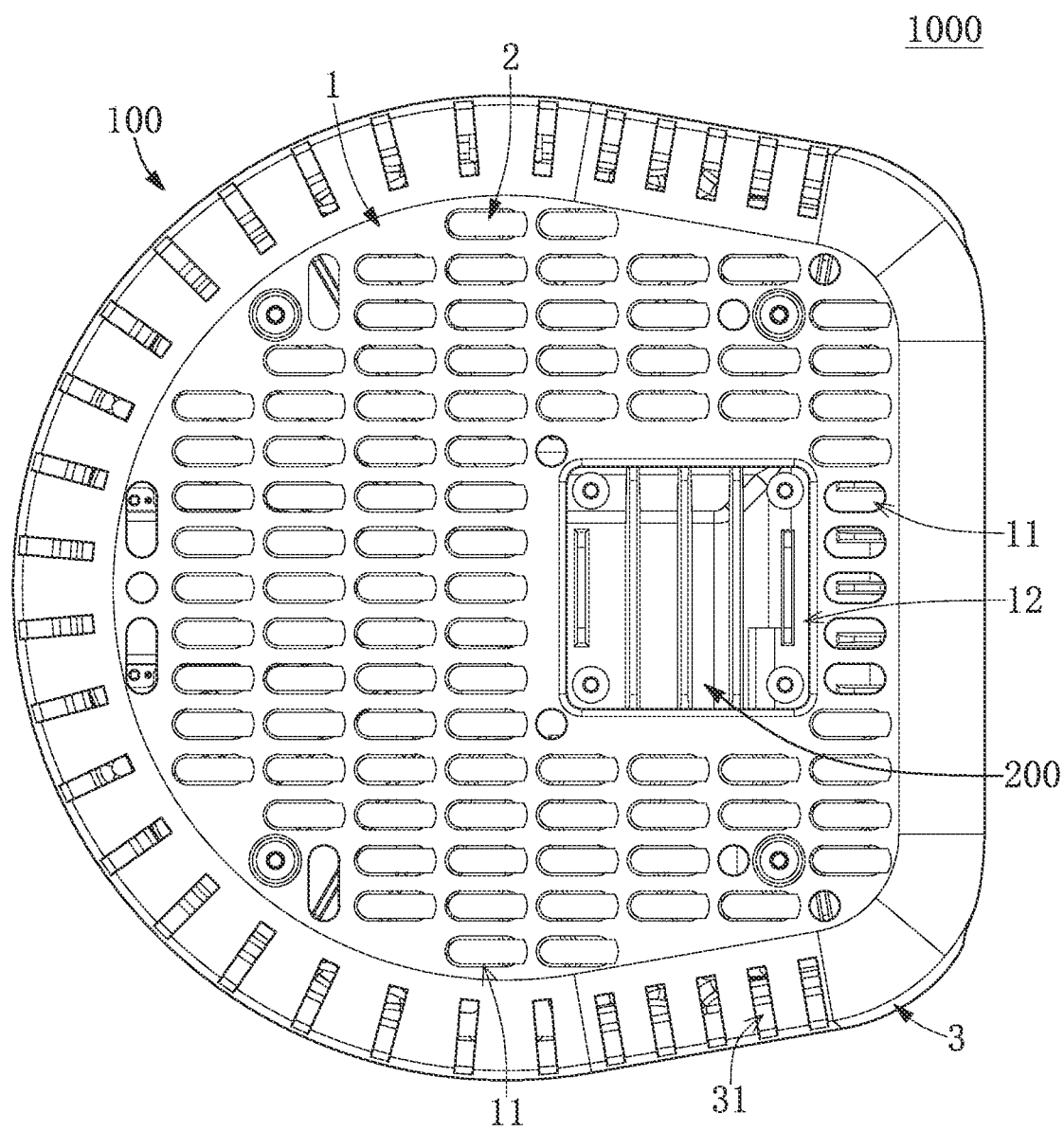
FIG. 2 is a top view of FIG. 1.

It should be noted that the sunshade 100 in the present embodiment is described in cooperation with the electronic device 200, but the present disclosure is not limited thereto. For example, in other embodiments of the present disclosure, the sunshade 100 can be independently used (e.g., sold) or can be used in cooperation with other devices. In the present embodiment, FIG. 1 and FIG. 2 show a specific structure of the outdoor electronic apparatus 1000, and FIG. 3 to FIG. 7 show schematic structures of the outdoor electronic apparatus 1000 for clearly describing most structural features, but the present disclosure is not limited thereto.

Figure 3:
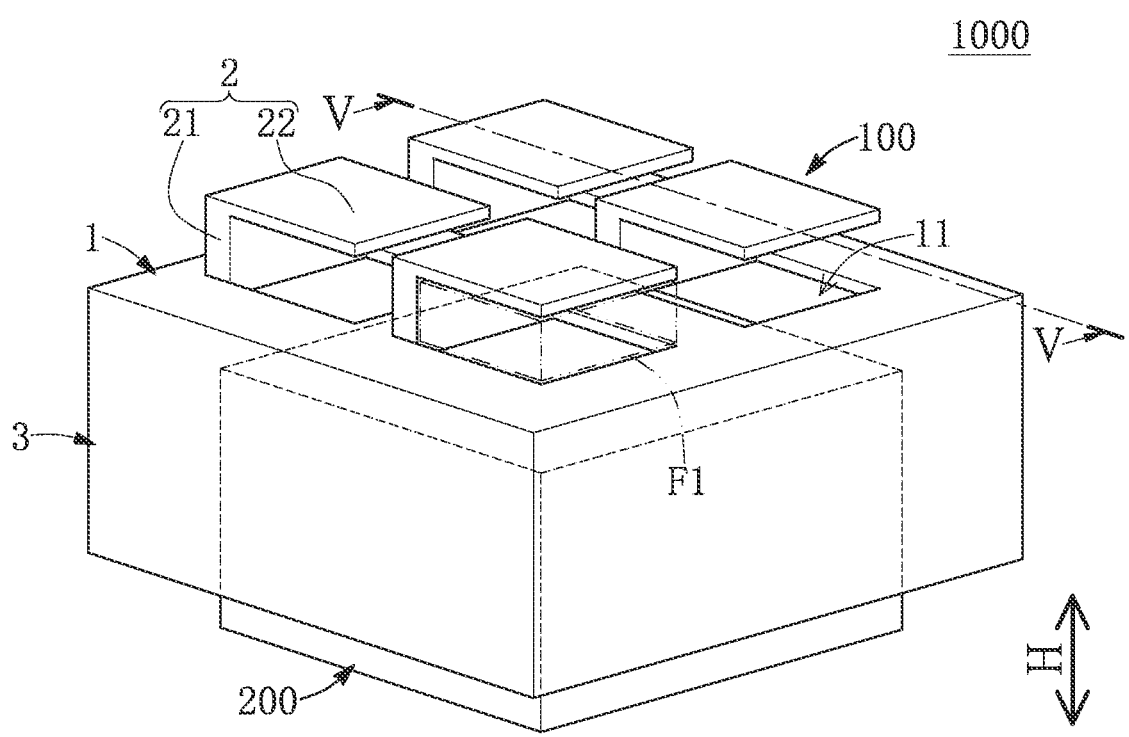
FIG. 3 is a schematic perspective view of the outdoor electronic apparatus according to the first embodiment of the present disclosure.
Figure 4:
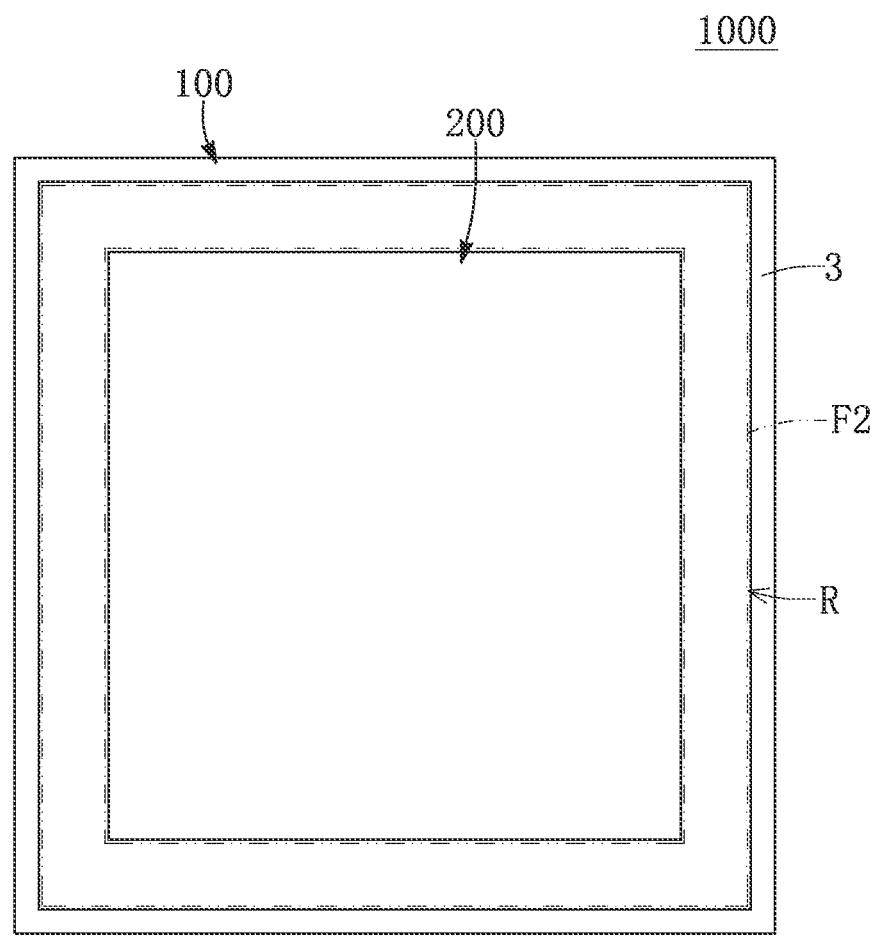
FIG. 4 is a bottom view of FIG. 3.
Figure 5:
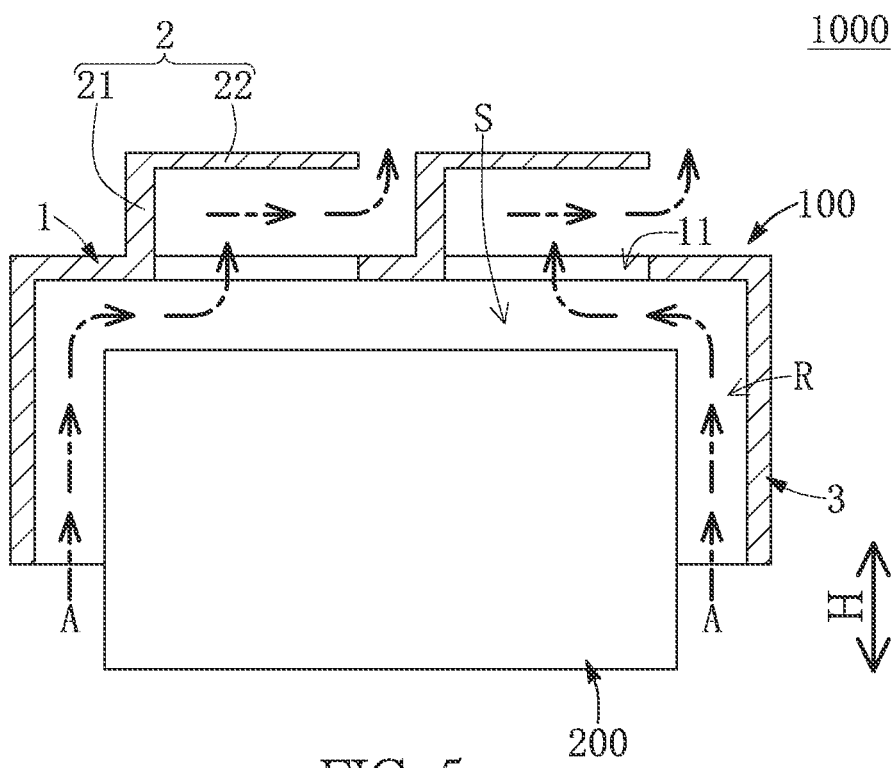
FIG. 5 is a cross-sectional view taken along line V-V of FIG. 3.
Figure 6:
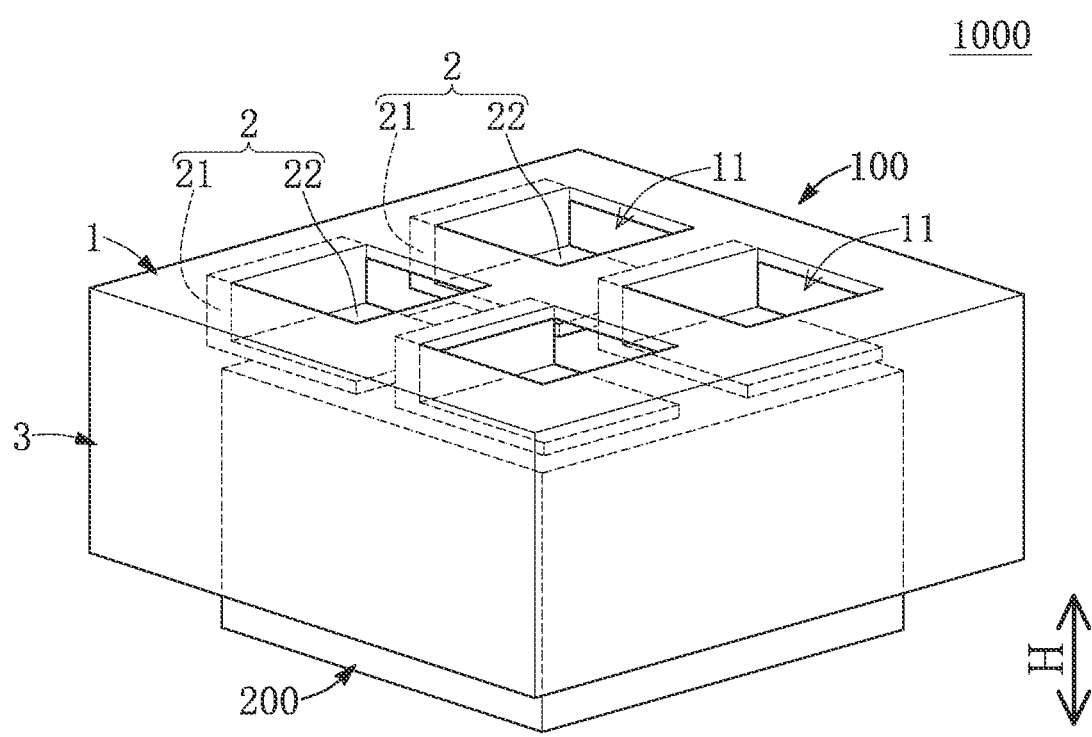
FIG. 6 is a schematic perspective view of the outdoor electronic apparatus in another configuration according to the first embodiment of the present disclosure.

As shown in FIG. 3 to FIG. 5, the sunshade 100 in the present embodiment is integrally formed as a single one-piece structure, and the sunshade 100 includes a top shield 1, a plurality of shielding structures 2 formed on the top shield 1, and a lateral shield 3 that is connected to (or extends from) a peripheral edge of the top shield 1. It should be noted that the sunshade 100 in the present embodiment is provided by forming the above elements, but in other embodiments of the present disclosure not shown in the drawings, the sunshade 100 can be provided without the lateral shield 3.

In the present embodiment, the top shield 1 is a flat board and has a plurality of top convection holes 11 penetrating there-through. Each of the top convection holes 11 has a hole area. Specifically, the top convection holes 11 in the present embodiment are substantially and uniformly distributed on the top shield 1 and have a substantially same shape (e.g., an elongated shape), but the present disclosure is not limited thereto. For example, in other embodiments of the present disclosure not shown in the drawings, the top convection holes 11 can be of different shapes; or, the top shield 1 is not a flat board.

At least part of the top convection holes 11 respectively correspond in position to the shielding structures 2, so that the shielding structures 2 can cover 1% to 100% (e.g., 20% to 100%) of a sum of the hole areas of the top convection holes 11 along a vertical direction H. Accordingly, the shielding structures 2 can be used to effectively shield sunlight for the top convection holes 11.

In the present embodiment, a quantity of the shielding structures 2 is equal to (as shown in FIG. 3) or less than (as shown in FIG. 1) a quantity of the top convection holes 11. In other words, a few of the top convection holes 11 can be not covered by the shielding structures 2, and the sum is obtained by adding together the hole areas of all of the top convection holes 11.

Furthermore, in other embodiments of the present disclosure not shown in the drawings, a quantity of the top convection hole 11 formed on the top shield 1 can be at least one, a quantity of the shielding structure 2 formed on the top shield 1 can be at least one, and the at least one shielding structure 2 corresponds in position to the at least one top convection hole 11, so that the at least one shielding structure 2 can cover 1% to 100% (e.g., 20% to 100%) of the hole area of the at least one top convection hole 11 along the vertical direction H.

Specifically, as shown in FIG. 3 to FIG. 5, the shielding structures 2 in the present embodiment are formed on one side of the top shield 1 (e.g., an upper side of the top shield 1) away from the electronic device 200, but the positions of the shielding structures 2 can be changed or adjusted according to design requirements. For example, as shown in FIG.

Figure 7:
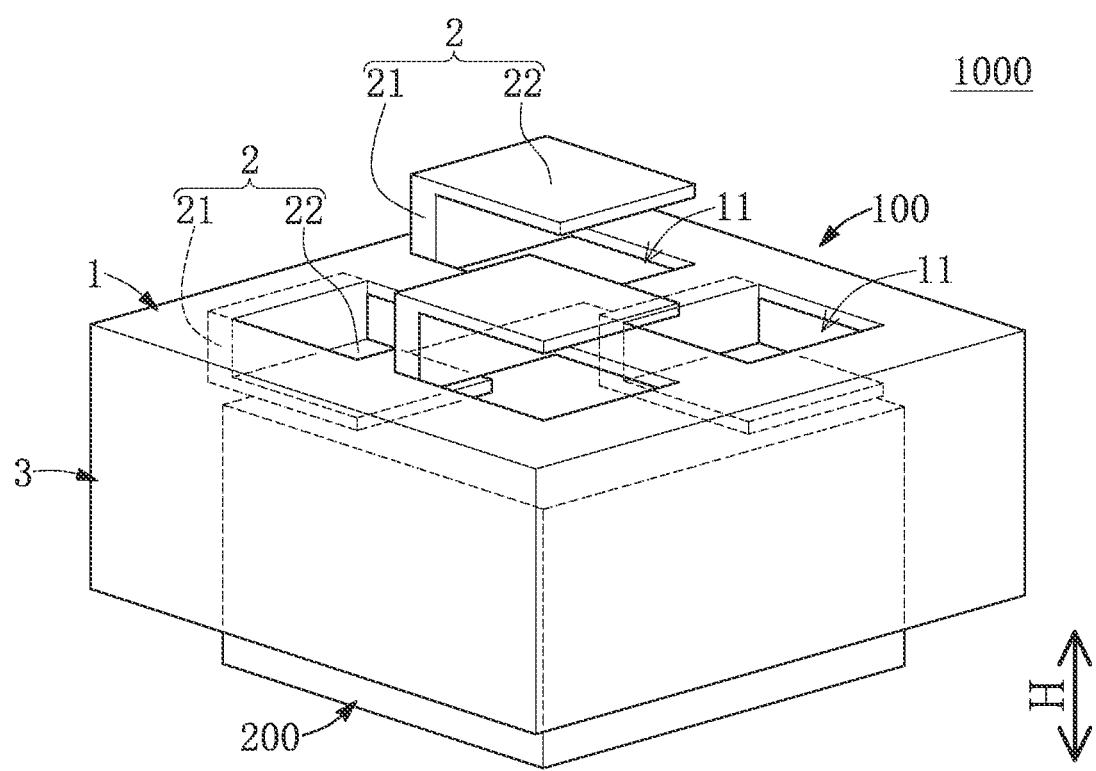
FIG. 7 is a schematic perspective view of the outdoor electronic apparatus in yet another configuration according to the first embodiment of the present disclosure.

6 and FIG. 7, at least one of the shielding structures 2 can be located between the electronic device 200 and the top shield 1; or, at least one of the shielding structures 2 can be formed on one side of the top shield 1 away from the electronic device 200.

As shown in FIG. 3 to FIG. 5, any one of the shielding structures 2 in the present embodiment extends from a hole edge of the corresponding top convection hole 11, and an edge of any one of the shielding structures 2 and the hole edge of the corresponding top convection hole 11 jointly define a first interface region F1 (e.g., a U-shaped region surrounded by two-dot chain lines shown in FIG. 3) having an outflow area, but the present disclosure is not limited thereto. For example, in other embodiments of the present disclosure not shown in the drawings, any one of the shielding structures 2 can be connected to a portion of the top shield 1 arranged adjacent to the corresponding top convection hole 11.

Moreover, the shielding structures 2 in the present embodiment have a substantially same structure (e.g., an L-shaped structure), and any one of the shielding structures 2 includes a supporting portion 21 that is connected to the top shield 1 and a shielding portion 22 that is connected to the supporting portion 21. The shape of the shielding portion 22 of any one of the shielding structures 2 is substantially identical to the shape of the corresponding top convection hole 11, and the shielding portions 22 of the shielding structures 2 respectively extend from the supporting portions 21 along a same direction, but the present disclosure is not limited thereto.

For example, in other embodiments of the present disclosure not shown in the drawings, the shielding structures 2 can be of different structures; or, the shape of any one of the shielding portions 22 can be different from the shape of the corresponding top convection hole 11; or, the shielding portions 22 of the shielding structures 2 can respectively extend from the supporting portions 21 along different directions.

As shown in FIG. 3 to FIG. 5, the lateral shield 3 in the present embodiment is in a loop shape, and a top portion (e.g., a heat sink) of the electronic device 200 is located in a space surrounded by the top shield 1 and the lateral shield 3. The top portion of the electronic device 200 and the top shield 1 have a heat dissipating space S there-between that is in spatial communication with the top convection holes 11, and the lateral shield 3 surrounds an outside of the heat dissipating space S.

Specifically, the sunshade 100 and an outer surface of the electronic device 200 jointly define a second interface region F2 (e.g., a loop-shaped region surrounded by two-dot chain lines shown in FIG. 4) that is in spatial communication with the heat dissipating space S and that has an inflow area. In the present embodiment, the lateral shield 3 and the top portion of the electronic device 200 have a loop-shaped space R there-between that is in spatial communication with the heat dissipating space S. Moreover, a cross section of the loop-shaped space R perpendicular to the vertical direction H has an area that is equal to the inflow area. In other words, the cross section of the loop-shaped space R can be regarded as the second interface region F2.

The outdoor electronic apparatus 1000 in the present embodiment enables airflow A to be received from the second interface region F2, and enables the airflow A to be guided and flow outside of the sunshade 100 by traveling along the heat dissipating space S, the top convection holes 11, and the first interface region F1, so that heat energy generated from the electronic device 200 can be transmitted outside of the sunshade 100 by the airflow A, but the present disclosure is not limited thereto.

It should be noted that, in order to allow the airflow A to smoothly flow in the outdoor electronic apparatus 1000, the connection relationship of the components of the outdoor electronic apparatus 1000 preferably satisfies the following conditions, but the present disclosure is not limited thereto. For example, in other embodiments of the present disclosure not shown in the drawings, the connection relationship of the components of the outdoor electronic apparatus 1000 can satisfy at least one of the following conditions.

In the present embodiment, the sum of the hole areas of the top convection holes 11 is greater than or equal to at least 20% (e.g., 30% to 150%) of a sum of the outflow areas of the top shield 1. In any one of the shielding structures 2 and the corresponding top convection hole 11, the hole area is greater than or equal to at least 20% (e.g., 30% to 150%) of the outflow area.

Accordingly, by the structural cooperation of the shielding structures 2 and the top convection holes 11 in the sunshade 100 of the present embodiment, any one of the shielding structures 2 can be configured to shield sunlight and to simultaneously avoid affecting the flow of air passing through the corresponding top convection hole 11, so that the outdoor electronic apparatus 1000 can have a better convection effect.

Moreover, the sum of the hole areas of the top convection holes 11 in the present embodiment is at least 20% (e.g., 30% to 150%) of the inflow area, and the inflow area in the present embodiment is greater than or equal to at least 20% (e.g., 30% to 150%) of the sum of the outflow areas of the top shield 1.

In addition, as shown in FIG. 1 and FIG. 2, the top shield 1 has an assembling opening 12, the top convection holes 11 are arranged to surround an outside of the assembling opening 12, and the top portion of the electronic device 200 can be fixed to an external object (not shown in the drawings) through the assembling opening 12. An area of the assembling opening 12 is greater than the hole area of any one of the top convection holes 11. In other words, any opening formed in a shield and provided for assembling is different from the top convection holes 11 of the present embodiment.

Furthermore, the lateral shield 3 in the present embodiment has a plurality of lateral convection holes 31 penetrating there-through, and the lateral convection holes 31 are arranged to surround an outside of the top convection holes 11. The sunshade 100 in the present embodiment does not have any shielding structure 2 corresponding in position to any one of the lateral convection holes 31, thereby enabling the lateral convection holes 31 to quickly dissipate heat energy, but the present disclosure is not limited thereto. For example, in other embodiments of the present disclosure not shown in the drawings, the lateral shield 3 can be formed without any of the lateral convection holes 31; or, the lateral shield 3 can include at least one shielding structure 2 corresponding in position to at least one of the lateral convection holes 31.

Second Embodiment

Figure 8:
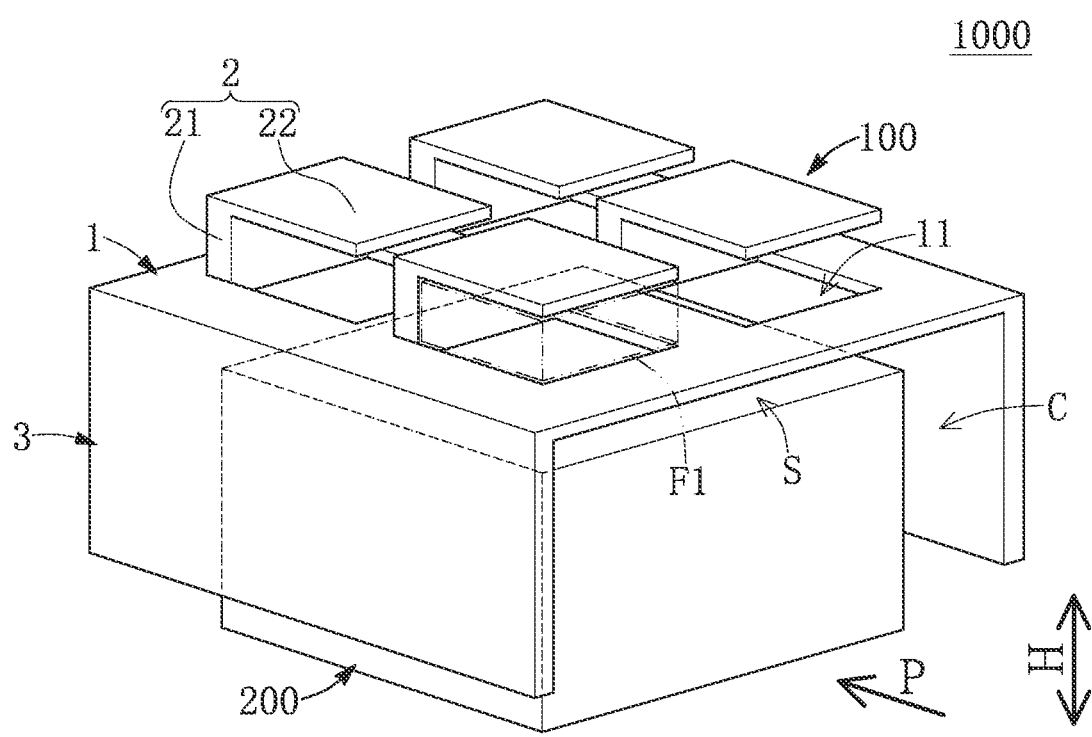
FIG. 8 is a schematic perspective view of the outdoor electronic apparatus according to a second embodiment of the present disclosure.
Figure 9:
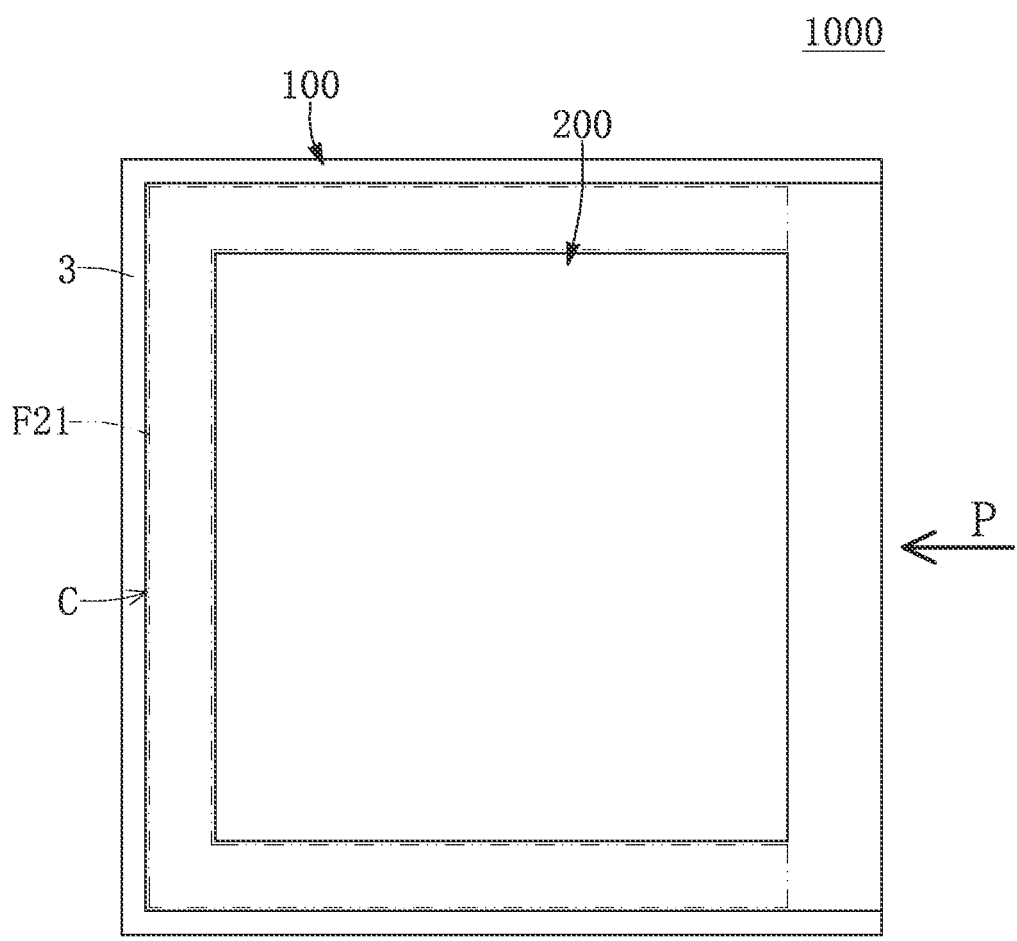
FIG. 9 is a bottom view of FIG. 8.
Figure 10:
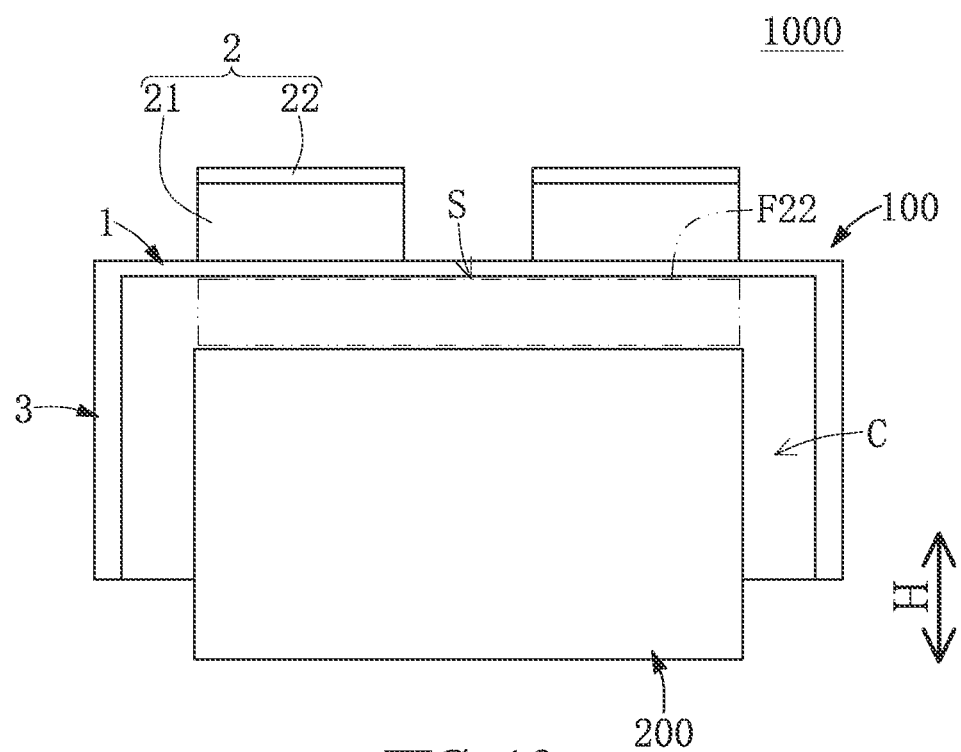
FIG. 10 is a side view of FIG. 8.

Referring to FIG. 8 to FIG. 10, a second embodiment of the present disclosure is similar to the first embodiment of the present disclosure. For the sake of brevity, descriptions of the same components in the first and second embodiments of the present disclosure (e.g., the top shield 1, the shielding structures 2, and the electronic device 200) will be omitted herein, and the following description only discloses different features between the first and second embodiments.

In the present embodiment, the lateral shield 3 is in a C-shape and surrounds a part of the heat dissipating space S, so that the lateral shield 3 and the top portion of the electronic device 200 have a C-shaped space C therebetween that is in spatial communication with the heat dissipating space S. The lateral shield 3 does not cover a part of the heat dissipating space S along a predetermined direction P perpendicular to the vertical direction H, and does not cover a part of the electronic device 200 along the predetermined direction P. In other words, the part of the heat dissipating space S (or the part of the electronic device 200) not covered by the lateral shield 3 corresponds in position to a notch of the C-shaped space C.

Specifically, the C-shaped space C has a cross section perpendicular to the vertical direction H, and the inflow area is equal to a sum of an area of the cross section of the C-shaped space C (e.g., an area of a region F21 surrounded by two-dot chain lines shown in FIG. 9) and an area of a cross section of the heat dissipating space S perpendicular to the predetermined direction P (e.g., an area of a region F22 surrounded by two-dot chain lines shown in FIG. 10). In other words, the second interface region in the present embodiment includes the region F21 shown in FIG. 9 and the region F22 shown in FIG. 10.

Third Embodiment

Figure 11:
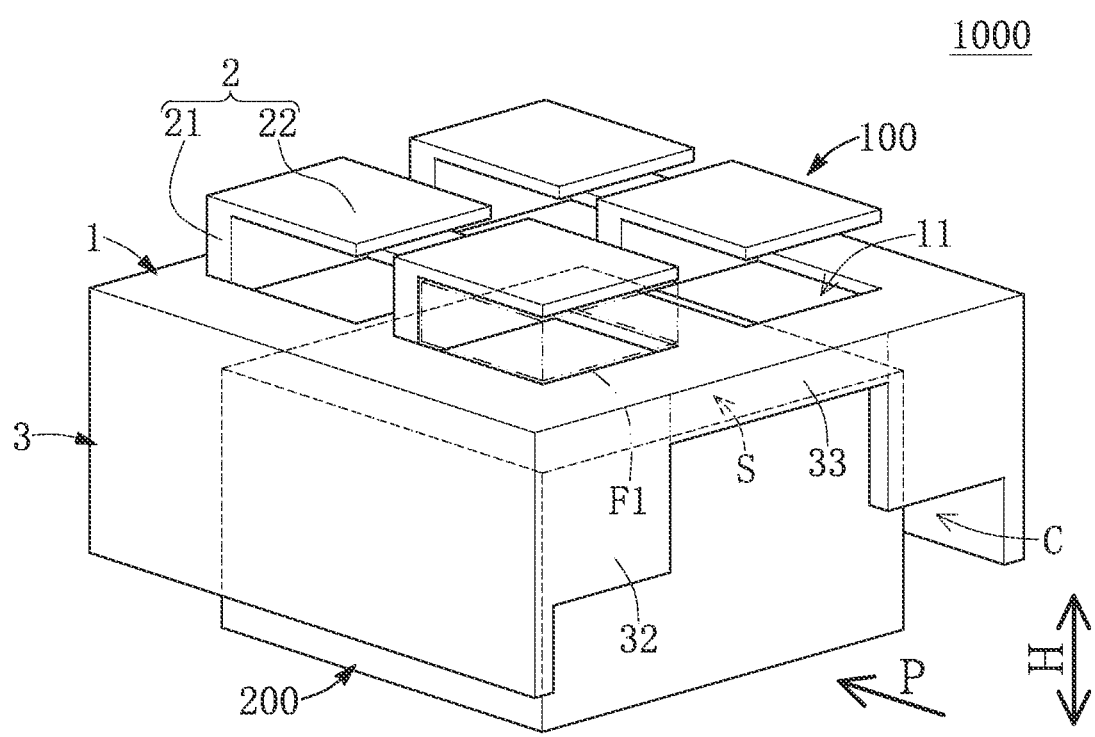
FIG. 11 is a schematic perspective view of the outdoor electronic apparatus according to a third embodiment of the present disclosure.
Figure 12:
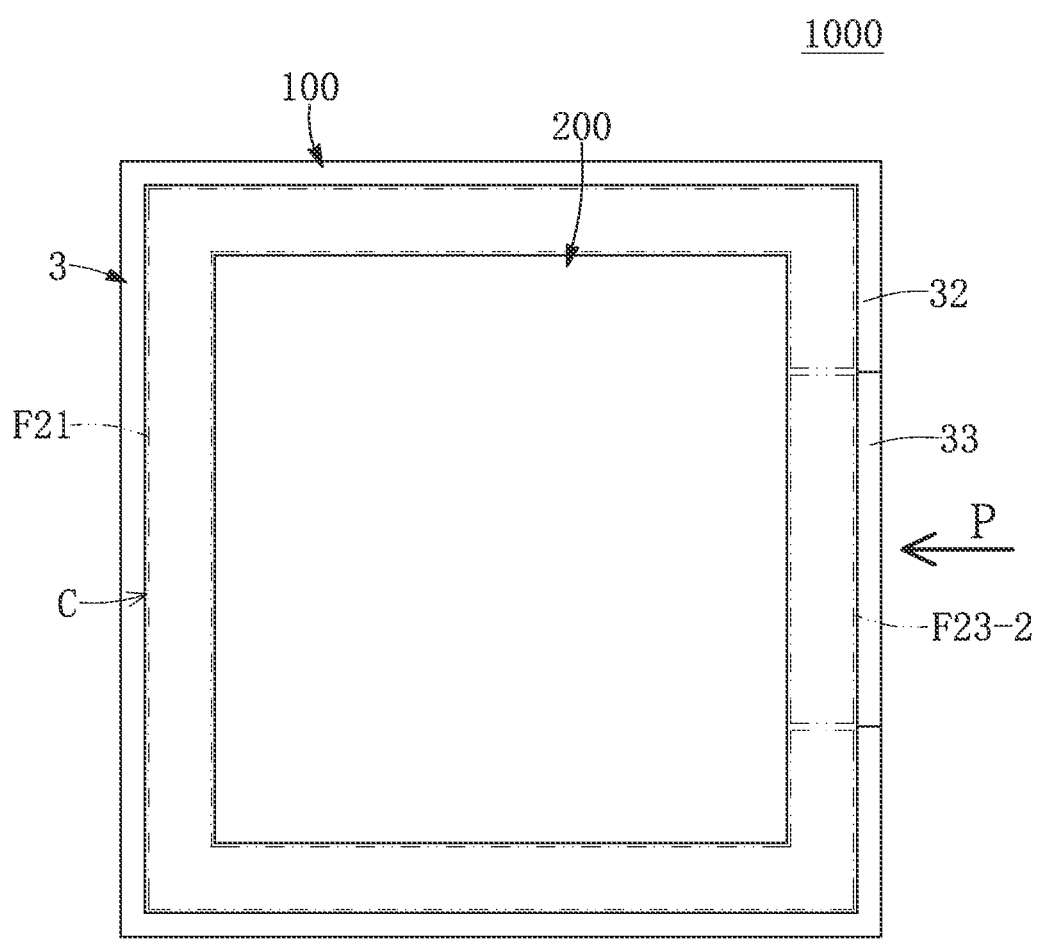
FIG. 12 is a bottom view of FIG. 11.
Figure 13:
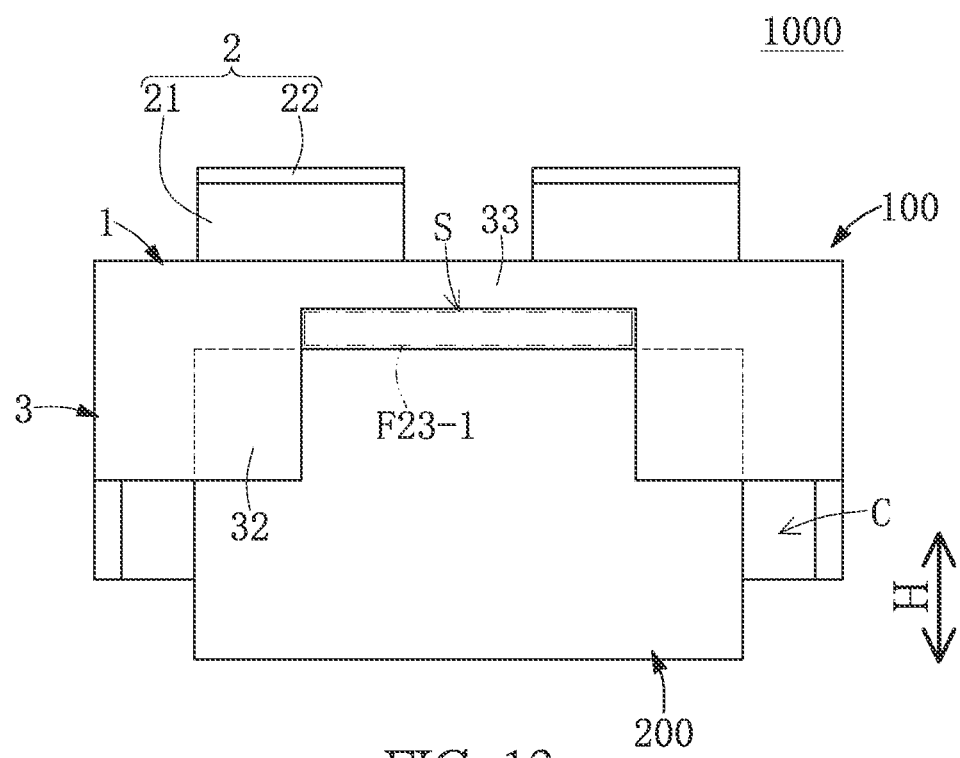
FIG. 13 is a side view of FIG. 11.

Referring to FIG. 11 to FIG. 13, a third embodiment of the present disclosure is similar to the first embodiment of the present disclosure. For the sake of brevity, descriptions of the same components in the first and third embodiments of the present disclosure (e.g., the top shield 1, the shielding structures 2, and the electronic device 200) will be omitted herein, and the following description only discloses different features between the first and third embodiments.

In the present embodiment, the lateral shield 3 includes a shielding segment 32 and an end segment 33. The shielding segment 32 in the present embodiment is in a C-shape and surrounds a part of the heat dissipating space S, so that the lateral shield 3 and the top portion of the electronic device 200 have a C-shaped space C there-between that is in spatial communication with the heat dissipating space S. The end segment 33 is connected to (or extends from) the shielding segment 32 and is located in a notch of the shielding segment 32, but the present disclosure is not limited thereto. For example, in other embodiments of the present disclosure not shown in the drawings, the shape of the shielding segment 32 can be changed or adjusted according to design requirements.

Moreover, the C-shaped space C has a cross section perpendicular to the vertical direction H. The end segment 33 does not cover a part of the heat dissipating space S along a predetermined direction P perpendicular to the vertical direction H. The part of the heat dissipating space S not covered by the end segment 33 has a transverse section (e.g., a region F23-1 surrounded by two-dot chain lines shown in FIG. 13) perpendicular to the predetermined direction P, and a region between the end segment 33 and the heat dissipating space S has a longitudinal section (e.g., a region F23-2 surrounded by two-dot chain lines shown in FIG. 12) perpendicular to the vertical direction H.

Specifically, the inflow area is equal to a sum of an area of the cross section (e.g., an area of a region F21 surrounded by two-dot chain lines shown in FIG. 12) of the C-shaped space C and a larger one of an area of the transverse section and an area of the longitudinal section. In other words, the second interface region in the present embodiment includes the region F21 shown in FIG. 12 and a larger one of the region F23-1 shown in FIG. 13 and the region F23-2 shown in FIG. 12.

For example, the area of the transverse section (e.g., the region F23-1) shown in FIG. 13 is less than the area of the longitudinal section (e.g., the region F23-2) shown in FIG. 12, so that the inflow area is equal to a sum of the area of the cross section of the C-shaped space C and the area of the longitudinal section, but the present disclosure is not limited thereto. In other words, in other embodiments of the present disclosure not shown in the drawings, the area of the transverse section can be greater than the area of the longitudinal section, so that the inflow area is equal to a sum of the area of the cross section of the C-shaped space C and the area of the transverse section.

Beneficial Effects of the Embodiments

In conclusion, the outdoor electronic apparatus of the present disclosure allows airflow to smoothly flow therein by the structural design of the sunshade or the structural cooperation of the sunshade and the electronic device (e.g., the inflow area is greater than or equal to at least 20% of the sum of the outflow areas of the top shield).

Specifically, by the structural cooperation of the shielding structures and the top convection holes in the sunshade of the present disclosure (e.g., the sum of the hole areas of the top convection holes is greater than or equal to at least 20% of the sum of the outflow areas of the top shield; or, in any one of the shielding structures and the corresponding top convection hole, the hole area is greater than or equal to at least 20% of the outflow area), any one of the shielding structures can be configured to shield sunlight and to simultaneously avoid affecting the flow of air passing through the corresponding top convection hole, so that the outdoor electronic apparatus can have a better convection effect.

Moreover, the shielding structures of the sunshade in the present disclosure cover 1% to 100% of the sum of the hole areas of the top convection holes along the vertical direction, so that the shielding structures can be used to effectively shield sunlight for the top convection holes.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An outdoor electronic apparatus, comprising:
   a sunshade including:
   a top shield having a plurality of top convection holes each having a hole area; and
   a plurality of shielding structures formed on the top shield, wherein at least part of the top convection holes respectively correspond in position to the shielding structures;

wherein an edge of any one of the shielding structures and a hole edge of the corresponding top convection hole jointly define a first interface region having an outflow area; and an electronic device assembled to the sunshade, wherein a top portion of the electronic device and the top shield have a heat dissipating space there-between that is in spatial communication with the top convection holes;

wherein the sunshade and an outer surface of the electronic device jointly define a second interface region that is in spatial communication with the heat dissipating space and that has an inflow area, and wherein the inflow area is greater than or equal to at least 20% of a sum of the outflow areas of the top shield, wherein the sunshade includes a lateral shield connected to a peripheral edge of the top shield, and the top portion of the electronic device is located in a space surrounded by the top shield and the lateral shield, wherein the lateral shield is C-shaped and surrounds a part of the heat dissipating space, so that the lateral shield and the top portion of the electronic device have a C-shaped space there-between that is in spatial communication with the heat dissipating space and that has a cross section perpendicular to a vertical direction, and wherein the lateral shield does not cover a part of the heat dissipating space along a predetermined direction perpendicular to the vertical direction, and the inflow area is equal to a sum of an area of the cross section of the C-shaped space and an area of a cross section of the heat dissipating space perpendicular to the predetermined direction.

2. The outdoor electronic apparatus according to claim 1, wherein a sum of the hole areas of the top convection holes is greater than or equal to at least 20% of a sum of the outflow areas of the top shield.

3. The outdoor electronic apparatus according to claim 1, wherein a sum of the hole areas of the top convection holes is at least 20% of the inflow area.

4. The outdoor electronic apparatus according to claim 1, wherein in any one of the shielding structures and the corresponding top convection hole, the hole area is greater than or equal to at least 20% of the outflow area.

5. The outdoor electronic apparatus according to claim 1, wherein at least one of the shielding structures is formed on one side of the top shield away from the electronic device.

6. The outdoor electronic apparatus according to claim 1, wherein at least one of the shielding structures is located between the electronic device and the top shield.

7. An outdoor electronic apparatus, comprising:
a sunshade including:
a top shield having a plurality of top convection holes each having a hole area; and
a plurality of shielding structures formed on the top shield, wherein at least part of the top convection holes respectively correspond in position to the shielding structures;

wherein an edge of any one of the shielding structures and a hole edge of the corresponding top convection hole jointly define a first interface region having an outflow area, and wherein a sum of the hole areas of the top convection holes is greater than or equal to at least 20% of a sum of the outflow areas of the top shield; and an electronic device assembled to the sunshade, wherein a top portion of the electronic device and the top shield have a heat dissipating space there-between that is in spatial communication with the top convection holes, wherein the sunshade includes a lateral shield connected to a peripheral edge of the top shield, and the top portion of the electronic device is located in a space surrounded by the top shield and the lateral shield, wherein the lateral shield is C-shaped and surrounds a part of the heat dissipating space, so that the lateral shield and the top portion of the electronic device have a C-shaped space there-between that is in spatial communication with the heat dissipating space and that has a cross section perpendicular to a vertical direction, and wherein the lateral shield does not cover a part of the heat dissipating space along a predetermined direction perpendicular to the vertical direction.

8. The outdoor electronic apparatus according to claim 7, wherein in any one of the shielding structures and the corresponding top convection hole, the hole area is greater than or equal to at least 20% of the outflow area.

9. The outdoor electronic apparatus according to claim 7, wherein the sunshade and an outer surface of the electronic device jointly define a second interface region that is in spatial communication with the heat dissipating space and that has an inflow area.

10. The outdoor electronic apparatus according to claim 9, wherein the inflow area is equal to a sum of an area of the cross section of the C-shaped space and an area of a cross section of the heat dissipating space perpendicular to the predetermined direction.

* * * * *